United States Patent [19]

Kim et al.

[11] Patent Number: 5,196,913
[45] Date of Patent: Mar. 23, 1993

[54] INPUT PROTECTION DEVICE FOR IMPROVING OF DELAY TIME ON INPUT STAGE IN SEMI-CONDUCTOR DEVICES

[75] Inventors: Chang-Hyun Kim; Hyun-Soon Jang, both of Seoul, Rep. of Korea

[73] Assignee: Samsung Electronics Co., Ltd., Suwon, Rep. of Korea

[21] Appl. No.: 634,797

[22] Filed: Dec. 28, 1990

Related U.S. Application Data

[63] Continuation-in-part of Ser. No. 333,432, Apr. 4, 1989, abandoned.

[30] Foreign Application Priority Data

Jul. 11, 1988 [KR] Rep. of Korea .................. 88-8604

[51] Int. Cl.$^5$ .................. H01L 29/78; H01L 27/02
[52] U.S. Cl. .................. 357/23.13; 357/41; 357/51
[58] Field of Search .................. 357/23.13, 41

[56] References Cited

U.S. PATENT DOCUMENTS

| | | | |
|---|---|---|---|
| 4,481,521 | 11/1984 | Okumura | 357/23.13 |
| 4,617,482 | 10/1986 | Matsuda | 357/23.13 |
| 4,692,781 | 9/1987 | Roundtree et al. | 357/23.13 |
| 4,710,791 | 12/1987 | Shirato et al. | 357/23.13 |
| 4,724,471 | 2/1988 | Leuschner | 357/51 |
| 4,730,208 | 3/1988 | Sugino et al. | 357/51 |
| 4,739,438 | 4/1988 | Sato | 357/23.13 |
| 4,777,518 | 10/1988 | Mihara et al. | 357/23.13 |
| 4,802,054 | 1/1989 | Yu et al. | 357/23.13 |
| 4,821,096 | 4/1989 | Maloney | 357/23.13 |
| 4,876,584 | 10/1989 | Taylor | 357/68 |
| 4,881,113 | 11/1989 | Momodomi et al. | 357/23.13 |
| 5,019,888 | 5/1991 | Scott et al. | 357/23.13 |

FOREIGN PATENT DOCUMENTS

| | | |
|---|---|---|
| 57-211273 | 12/1982 | Japan . |
| 0161375 | 9/1983 | Japan .................. 357/23.13 |
| 59-224164 | 12/1984 | Japan . |

Primary Examiner—Eugene R. LaRoche
Assistant Examiner—Viet Q. Nguyen
Attorney, Agent, or Firm—Ladas & Parry

[57] ABSTRACT

This invention provides an input protection device having, within a body of semiconductor material, parallel, doped regions providing an input circuit and a charge collection area for protecting against static electricity charges at the input stage of semiconductor devices, the device including a low resistance layer formed on the body overlying the input circuit which is connected to an input pad on the body. Shortening the input signal delay time is thus attained.

4 Claims, 3 Drawing Sheets

INPUT PROTECTION DEVICE FOR IMPROVING OF DELAY TIME ON INPUT STAGE IN SEMI-CONDUCTOR DEVICES

This is a continuation-in-part of copending application Ser. No. 07/333,432 filed on Apr. 4, 1989, abandoned.

BACKGROUND OF THE INVENTION

This invention relates to an input protection device for static electricity discharges at the input stages of semiconductor integrated circuits, and particularly to such protection devices for improving the signal delay time at the input stage of the integrated circuits.

In IC design, protection devices against discharge of static electricity charges are provided at the input stage of the ICs. Most semiconductor ICs, such as semiconductor memories have such protection devices in order to protect them from destruction resulting from instantaneous static charges coming from the human body or other sources.

A conventional protection device against static charge at an input stage will now be described with reference to FIG. 1 which shows one example of such conventional device.

FIG. 1(A) is a plan view of a layout of the input stage of a conventional integrated circuit and shows the charge collection area 2 connected with Vss and the input path area 3 connected with the input pad.

FIG. 1(B) is a cross-sectional view along the line a—a' of FIG. 1(A) and shows an n+ diffusion layer of the input path area 3 and an n+ diffusion layer of the charge collection area 2 on a p type Si-substrate.

FIG. 1(C) is an equivalent circuit diagram of the device of FIGS. 1A and 1B.

FIG. 1(C) shows an input pad 4 which is connected to the input path area 3. The input signal is applied to the pad 4 and is conveyed to the first or input stage of the integrated circuit (not shown) via the area 3. There is some delay of the signal coming through the input pad 4 by the diffusion layer resistance R3 of the input path area 3. Static charges which come through the input pad 4 are collected in the charge area 2 via the transistor 1. As a result, the IC is protected from destruction by the static charges. But, the path of the input circuit 3 should be long in order to increase the effective charge collection area, which causes an increase of the diffusion resistance. Thus, the input area 3 provides a long delay time. This, in turn, causes a decrease in the performance of the overall integrated circuit.

SUMMARY OF THE INVENTION

The present invention has been made in consideration of this and has its object to provide an input protection device for improving the delay time at the input stage in semiconductor devices, according to which invention, shortening the delay time for signal propagation is achieved without reducing the static charge collecting capacity of the device.

According to the present invention, there is provided an input protection device for improving the delay time at the input stage of semiconductor devices which includes a low resistance layer on the input path area connected with the input pad on the Si-substrate.

DETAILED DESCRIPTION OF A PREFERRED EMBODIMENT

The protection device of the present invention will now be described in more detail with reference to the accompanying drawings.

Figure 1A:
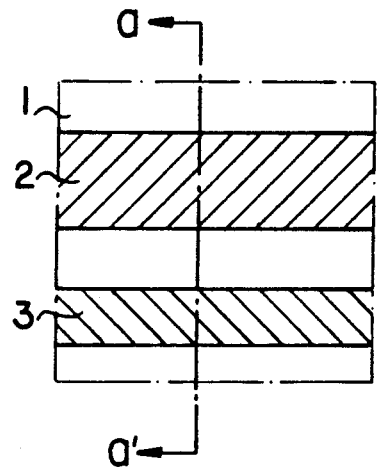
FIG. 1(A) is a plan view of a layout of a conventional protection device for static discharge at an input stage.
Figure 2A:
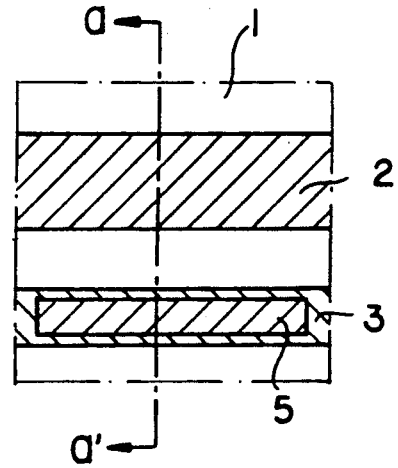
FIG. 2(A) is a plan view of a layout of a protection device for static discharge at an input stage in accordance with the present invention.
Figure 1B:
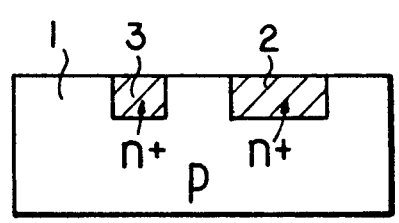
FIG. 1(B) is a cross-sectional view along the line a—a' of FIG. 1(A)
Figure 2B:
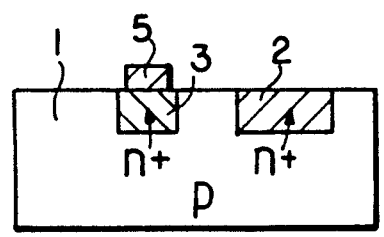
FIG. 2(B) is a cross-sectional view along the line a—a' of FIG. 2(A)
Figure 1C:
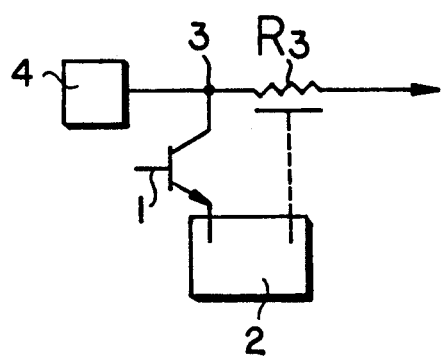
FIG. 1(C) is an equivalent circuit diagram of the conventional protection device shown in FIGS. 1(A) and 1(B)

As shown in FIG. 2(A) and FIG. 2(B) an n+ diffusion region or layer of the charge collection area 2 and an n+diffusion region or layer of the path area 3 of the input circuit are formed on the p-type substrate 1, respectively.

Figure 2C:
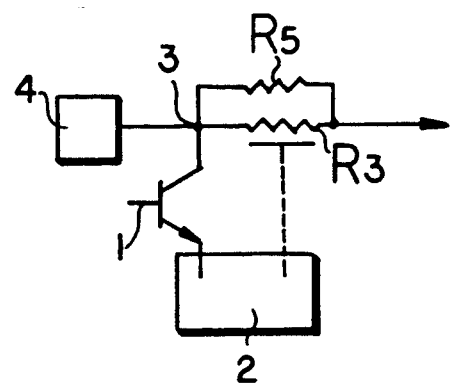
FIG. 2(C) is a equivalent circuit diagram of the protection device shown in FIGS. 2(A) and 2(B)

A low resistance layer 5 is formed on the path area 3 of the input circuit. An equivalent circuit is shown in FIG. 2(C).

The static charges coming through the input pad 4 are collected in the charge collection area 2 and the input signal coming through the input pad 4 is propagated through the diffusion resistance R3 and the low resistance R5. Therefore, shortening of the propagating time of the input signal is attained without reducing the static charge collecting capacity of the device. The propagating time of the input signal is shortened by means of the reduced path resistance provided by the parallel circuit of the resistance R3 and R5. This, in turn, enhances the speed characteristics of integrated circuits using the inventive protection device.

Figure 3A:
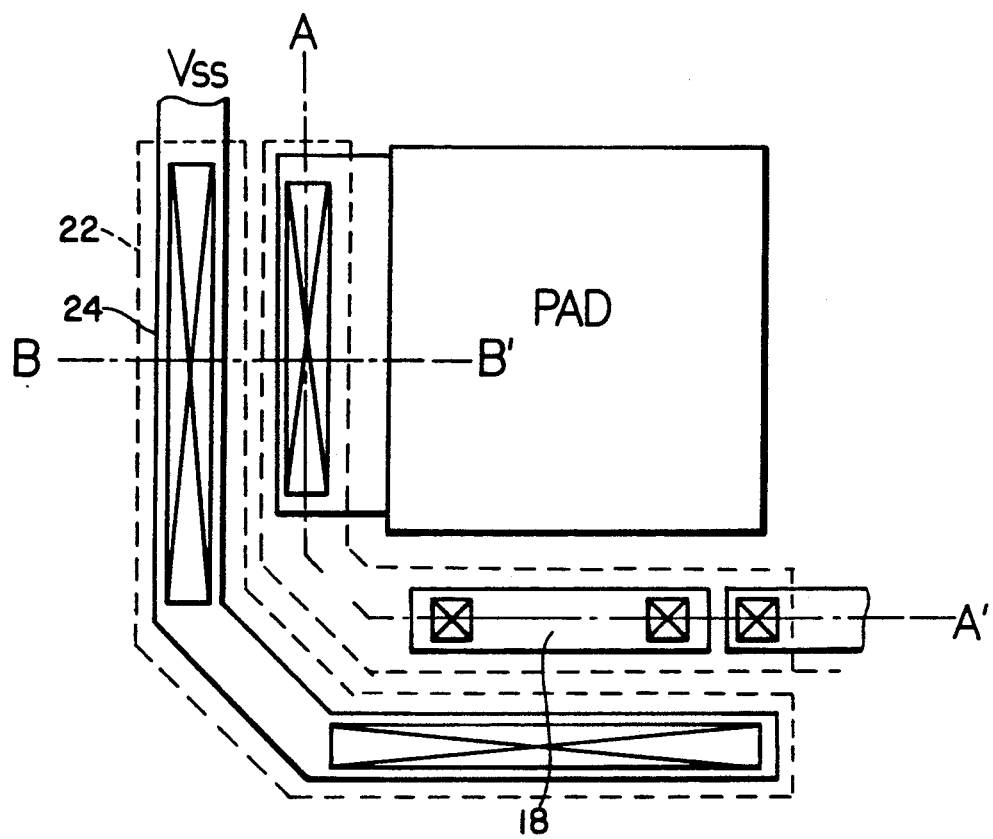
FIG. 3(A) is a plan view similar to that of FIG. 2(A) but showing a different embodiment of the invention.

Another embodiment of the invention is shown in FIGS. 3(A)–(3D).

Figure 3B:
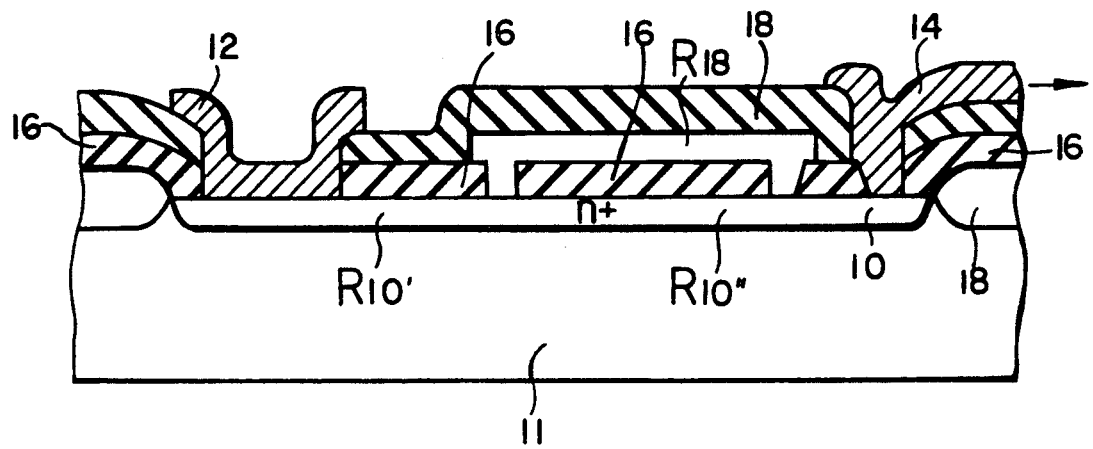
FIG. 3(B) is a cross-sectional view along the line A—A' of FIG. 3(A)
Figure 3C:
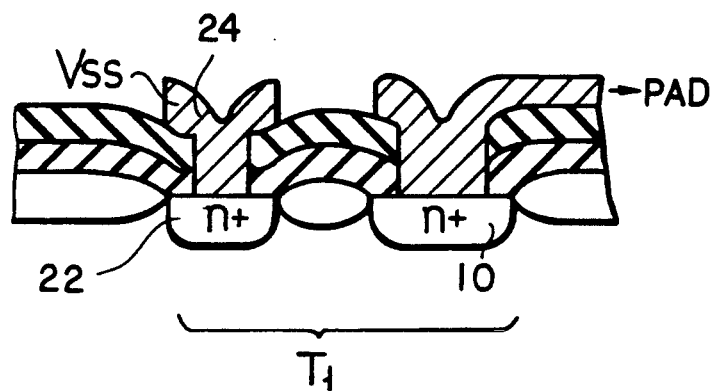
FIG. 3(C) is a cross-sectional view along the line B—B' of FIG. 3(B)
Figure 3D:
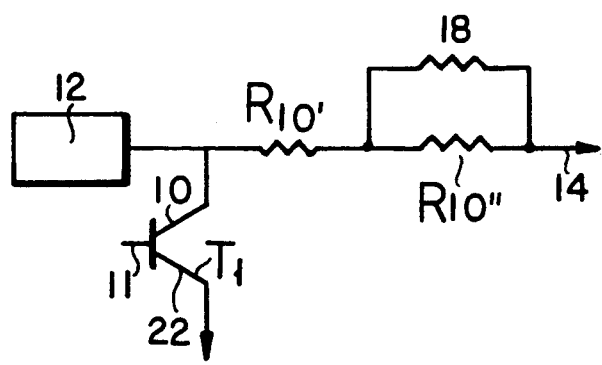
FIG. 3(D) is an equivalent circuit diagram of the protection device shown in FIGS. 3(A)–3(C).

As shown in FIGS. 3(A) and 3(B), an N+ diffusion region 10 is formed within a p-type substrate 11, the region 10 comprising a conductive path $R_{10}'$—$R_{10}''$ (FIG. 3(D)) for an input signal applied to a metal pad 12 to an internal circuit (not shown) connected to the path $R_{10}'$—$R_{10}''$ via a metal strip 14 (FIG. 3(B)).

As shown in FIG. 3(B), the surface of the substrate is covered by an insulating layer 16, and the metal pad 12 and the metal strip 14 are ohmically connected to the region 10 through openings through the insulating layer 16.

Overlying the insulating layer 16 is another metal strip 18 ohmically connected to spaced apart portions of the region 10 through contact openings through the layer 16. The purpose of the metal strip 18 is to provide a low resistance path for the incoming signal in parallel to the path provided by the region 10.

An equivalent circuit for the protection device is shown in FIG. 3(D). The path for the input signal comprises the metal pad 12, a first portion $R_{10}'$ of the region 10, the parallel paths comprising the portion $R_{10}''$ of the region 10 and the metal strip $R_{18}$ overlying the region 10, and the metal strip 14.

FIG. 3(D) also shows a transistor $T_1$ for discharging high frequency static charges to the substrate to prevent harm to the internal circuits of the semiconductor chip. The transistor $T_1$ is formed from an additional n+ diffusion region 22 within the substrate (FIGS. 3(A) and 3(C)) which extends within the substrate 11 parallel to the n+ diffusion region 10 and spaced therefrom by the p-type material of the substrate. As shown in FIG. 3(C), the n+ region is connected to a metal strip 24 by means of which the region 22 can be connected to ground potential (VSS).

We claim:

1. An input protection device for a semiconductor device including a substrate of semiconductor material of a first conductivity type, a signal input pad on a surface of said substrate, a first region, having first and second ends, of a second conductivity type within said substrate, said first end being connected to said input pad, said first region providing an electrical path between said ends thereof for an electrical signal, and a signal conductor connected to said second end for extending said electrical path beyond said first region, a second region of said second conductivity type within said substrate spaced from said first region and providing means for collecting static charges arriving along said first region, and a layer of low resistance material disposed on the surface of said substrate overlying and in direct contact with said first region for reducing the electrical resistance of said electrical path between said ends.

2. A device according to claim 1 wherein said signal conductor is directly connected to said second end and only indirectly connected to said layer of low resistance material via said first region.

3. An input protection device for a semiconductor device including a substrate of semiconductor material of a first conductivity type, a signal input pad on a surface of said substrate, a first region having spaced apart portions, of a second conductivity type within said substrate connected to said input pad and providing an electrical path between said portions thereof for an electrical signal, a second region of said second conductivity type within said substrate spaced from said first region and providing means for collecting static charges arriving along said first region, a layer of insulating material on the surface of said substrate overlying said first region, and a layer of low resistance material disposed on said layer of insulating material, said layer of insulating material having openings therethrough, and said low resistance layer extending through said openings into direct ohmic contact with said spaced apart portions of said first region.

4. A device according to claim 3 including a signal conductor connected to said first region for extending the path for an electrical signal, said signal conductor being spaced from direct contact with said layer of low resistance material by said layer of insulating material.

* * * * *